United States Patent
Kim et al.

(10) Patent No.: US 7,342,432 B2
(45) Date of Patent: Mar. 11, 2008

(54) MIXER CIRCUIT HAVING IMPROVED LINEARITY AND NOISE FIGURE

(75) Inventors: Tae-Wook Kim, Seoul (KR); Bon-Kee Kim, Youngin-si (KR); Kwy-Ro Lee, Daejeonkwangyek-si (KR)

(73) Assignee: Integrant Technologies Inc., Kyunggi-Do (KR)

( * ) Notice: Subject to any disclaimer, the term of this patent is extended or adjusted under 35 U.S.C. 154(b) by 0 days.

(21) Appl. No.: 10/775,234

(22) Filed: Feb. 11, 2004

(65) Prior Publication Data

US 2004/0160264 A1    Aug. 19, 2004

(30) Foreign Application Priority Data

Feb. 13, 2003   (KR) .................... 10-2003-0009013

(51) Int. Cl.
*G06G 7/16*   (2006.01)
(52) U.S. Cl. .................. 327/359; 327/355; 327/362; 455/326; 330/254
(58) Field of Classification Search ............ 327/355–7, 327/359, 362, 538, 540, 541; 455/323, 326; 330/252, 259, 261, 254
See application file for complete search history.

(56) References Cited

U.S. PATENT DOCUMENTS

| | | | | |
|---|---|---|---|---|
| 5,532,637 A | | 7/1996 | Khoury et al. | |
| 5,572,166 A | * | 11/1996 | Gilbert | 330/254 |
| 5,748,041 A | * | 5/1998 | Kimura | 330/254 |
| 5,949,286 A | * | 9/1999 | Jones | 330/254 |
| 6,094,084 A | * | 7/2000 | Abou-Allam et al. | 327/359 |
| 6,147,559 A | * | 11/2000 | Fong | 330/311 |
| 6,205,325 B1 | * | 3/2001 | Groe | 455/333 |
| 6,275,110 B2 | * | 8/2001 | Kung | 330/261 |
| 6,308,058 B1 | * | 10/2001 | Souetinov et al. | 455/326 |

* cited by examiner

*Primary Examiner*—N. Drew Richards
*Assistant Examiner*—An T. Luu
(74) *Attorney, Agent, or Firm*—Global IP Counselors, LLP

(57) ABSTRACT

A mixer circuit having improved linearity and noise figure is disclosed. The mixer circuit comprises an amplification unit having an input terminal and an output terminal, the amplification unit amplifying a signal applied to the input terminal to output it to the output terminal; a mixing unit having first, second and third input terminals, and first and second output terminals, the mixing unit mixing signals respectively applied to the first and second input terminals with a signal supplied to the third input terminal, to respectively output the mixed signals to the first and second output terminals; a capacitor connected between the output terminal of the amplification unit and the third input terminal of the mixing unit; and a current source for providing a specific quantity of current to the third input terminal of the mixing unit such that the quantity of current flowing through the third input terminal of the mixing unit is substantially larger than the quantity of current flowing through the amplification unit.

9 Claims, 6 Drawing Sheets

MIXER CIRCUIT HAVING IMPROVED LINEARITY AND NOISE FIGURE

TECHNICAL FIELD

The present invention relates to a communication system and, more particularly, to a mixer circuit having improved linearity and noise figure.

BACKGROUND OF THE INVENTION

A mixer circuit is generally used for modulation and demodulation of signals in a communication system. This mixer circuit mixes at least two input signals to output a signal having a frequency corresponding to the difference between mixed two signals or the sum of the two signals.

FIG. 1 is a circuit diagram of a Gilbert cell mixer circuit that is a conventional typical mixer circuit. Referring to FIG. 1, the conventional mixer circuit includes an amplification unit 110 and a mixing unit 130. The amplification unit 110 is composed of a first NPN transistor BN11 and a degeneration impedance L11, and amplifies a signal applied to an input Vin to output it to the mixing unit 130. The mixing unit 130 includes second and third NPN transistors BN12 and BN13, first and second load resistors R11 and R12. The mixing unit 130 mixes the signal outputted from the amplification unit 110 with local oscillation signals LO+ and LO−, to output a baseband signal.

The operation of the mixer circuit shown in FIG. 1 and problems in the circuit will be described hereinafter.

The amplification unit 110 of the mixer circuit has a common emitter structure and amplifies a signal Vin applied to the base of the first NPN transistor BN11 to output it to the mixing unit 130. The mixing unit 130 of the mixer circuit has a base common structure and mixes the output signal of the amplification unit 110 with the local oscillation signals LO+ and LO− to output an intermediate frequency or baseband signal.

That is, the mixer circuit shown in FIG. 1 is constructed in such a manner that the amplification unit 110 having a common emitter structure and the mixing unit 130 having a common base structure are connected to each other and the local oscillation signals LO+ and LO− are respectively applied to the bases of the second and third NPN transistors BN12 and BN13 to be mixed with an RF signal applied to the base of the first NPN transistor BN11.

In the conventional mixer circuit shown in FIG. 1, however, it is difficult to utilize the mixer circuit in an optimal manner in terms of linearity and noise figure because the amplification unit 110 is directly connected to the mixing unit 130. Specifically, current flowing through the first NPN transistor BN11 of the amplification unit 110 has the same value as the sum of currents flowing through the second and third NPN transistors BN12 and BN13. Accordingly, when the quantity of currents flowing through the second and third NPN transistors BN12 and BN13 of the mixing unit 130 is increased in order to improve linearity of the mixer circuit, the current flowing through the first NPN transistor BN11 is also increased. This raises gain of the amplification unit 110. An increase in the gain of the amplification unit 110 deteriorates linearity of the mixer circuit. Furthermore, in the case where the current flowing through the first NPN transistor BN11 is increased while voltage Vce across the collector and emitter of the first NPN transistor BN11 is constant, linearity of the amplification unit is decreased. Moreover, it is difficult to optimize linearity and noise figure of the mixer circuit because gains of the amplification unit 110 and mixing unit 130 cannot be independently controlled.

That is, in the case where the mixer circuit is constructed in a manner that the amplification unit 110 and the mixing unit 130 are directly connected to each other although conditions for optimizing linearity and noise figure of the amplification 110 are different from them of the mixing unit 130, linearity and noise figure of the mixer circuit are deteriorated.

U.S. Pat. No. 5,532,637 proposes a mixer circuit for improving linearity and noise figure thereof. FIG. 2 shows a circuit diagram of the mixer circuit disclosed in U.S. Pat. No. 5,532,637.

Referring to FIG. 2, the mixer circuit includes three pairs of transistors 11, 12, 15, 16, 17 and 18, first and second current sources 10 and 22. The first pair of transistors 11 and 12 controls current flowing between their collectors and emitters according to a first input signal applied differentially to first input terminals I/P1+ and I/P1−. The two second pairs of transistors 15, 16, 17 and 18 control the quantity of currents flowing through them according to a second input signal applied to second input terminals I/P+ and I/P− and the current of a corresponding transistor of the first pair of transistors. The second current source 10 provides for the total current passed by the first pair of transistors 11 and 12 to be greater than the total current passed by the two second transistors 15, 16, 17 and 18.

The prior art mixer circuit shown in FIG. 2 has the current source 22 at the input terminal of the mixer to improve linearity of the mixer circuit. However, it is known that currents, supplied to the collectors of the first pair of transistors 11 and 12 after the voltage Vce across the collectors and emitters of the first pair of transistors has been determined, do not improve linearity but deteriorate noise figure and current consumption (Guofu niu, et al., "RF Linearity Characteristics of SiGe HBTs", IEEE, Transaction of Microwave theory and Techniques, vol. 49, No. 9, September 2001).

Accordingly, in the case where the voltage between the collector and emitter is uniform, as shown in FIG. 2, there are limitations in improving linearity by providing more current to the amplification unit. Furthermore, there is also a limitation in increasing the current and the voltage across the collector and emitter, simultaneously, because of Vcc. Moreover, although larger quantity of currents flowing through the two second pairs of transistors 15, 16, 17 and 18 included in the mixing unit can obtain high linearity, linearity of the mixer circuit disclosed in U.S. Pat. No. 5,532, 637 is deteriorated since the quantity of current flowing through the mixing unit is smaller than the quantity of current flowing through the amplification unit.

SUMMARY OF THE INVENTION

An object of the present invention is to provide a mixer circuit having improved linearity and noise figure.

Another object of the present invention is to provide a mixer circuit which optimizes its linearity and noise figure by independently controlling its amplification unit and mixing unit.

Still another object of the present invention is to provide a mixer circuit which minimizes the influence of parasitic capacitance generated at the input terminals of the amplification unit and mixing unit of the circuit.

To accomplish the objects of the present invention, according to one aspect of the present invention, there is provided a mixer circuit including: an amplification unit having an input terminal and an output terminal, the amplification unit amplifying a signal applied to the input terminal to output it to the output terminal; a mixing unit having first, second and third input terminals, and first and second output terminals, the mixing unit mixing signals respectively applied to the first and second input terminals with a signal supplied to the third input terminal, to respectively output the mixed signals to the first and second output terminals; a capacitor connected between the output terminal of the amplification unit and the third input terminal of the mixing unit; and a current source for providing a specific quantity of current to the third input terminal of the mixing unit such that the quantity of current flowing through the third input terminal of the mixing unit is substantially larger than the quantity of current flowing through the amplification unit.

In the mixer circuit in accordance with one aspect of the present invention, the amplification unit includes an amplification element having a first terminal that forms the input terminal, a second terminal that forms the output terminal and a third terminal, wherein the quantity and direction of current flowing from the second terminal to the third terminal are varied on the basis of the level of a voltage applied to the first terminal; a load impedance connected between the second terminal of the amplification element and a first voltage source; and a degeneration impedance connected between the third terminal of the amplification element and a second voltage source.

In the mixer circuit in accordance with one aspect of the present invention, the amplification unit further includes a capacitor connected between the first and second terminals of the amplification element.

In the mixer circuit in accordance with one aspect of the present invention, the mixing unit includes a first amplification element having a first terminal that forms the first input terminal, a second terminal that forms the first output terminal and a third terminal, wherein the quantity and direction of current flowing from the second terminal to the third terminal are varied on the basis of the level of a voltage applied to the first terminal; a second amplification element having a first terminal that forms the second input terminal, a second terminal that forms the second output terminal, and a third terminal connected to the third terminal of the first amplification element to form the third input terminal, wherein the quantity and direction of current flowing from the second terminal to the third terminal are varied on the basis of the level of the voltage applied to the first terminal; and first and second load impedances connected between the second terminals of the first and second amplification elements and a voltage source, respectively.

In the mixer circuit in accordance with one aspect of the present invention, the current source includes an LC resonance circuit.

In accordance with another aspect of the present invention, there is also provided a mixer circuit including: an amplification unit having an input terminal and an output terminal, the amplification unit amplifying a signal applied to the input terminal to output it to the output terminal; a mixing unit having first, second and third input terminals, and first and second output terminals, the third input terminal being connected to the output terminal of the amplification unit, the mixing unit mixing signals respectively applied to the first and second input terminals with a signal supplied to the third input terminal, to respectively output the mixed signals to the first and second output terminals; and a current source for providing a specific quantity of current to the third input terminal of the mixing unit.

In the mixer circuit in accordance with another aspect of the present invention, the amplification unit includes an amplification element having a first terminal that forms the input terminal, a second terminal that forms the output terminal and a third terminal, wherein the quantity and direction of current flowing from the second terminal to the third terminal are varied on the basis of the level of a voltage applied to the first terminal; and a degeneration impedance connected between the third terminal of the amplification element and a second voltage source.

In the mixer circuit in accordance with another aspect of the present invention, the amplification unit further includes a capacitor connected between the first and second terminals of the amplification element.

In the mixer circuit in accordance with another aspect of the present invention, the mixing unit includes a first amplification element having a first terminal that forms the first input terminal, a second terminal that forms the first output terminal and a third terminal, wherein the quantity and direction of current flowing from the second terminal to the third terminal are varied on the basis of the level of a voltage applied to the first terminal; a second amplification element having a first terminal that forms the second input terminal, a second terminal that forms the second output terminal, and a third terminal connected to the third terminal of the first amplification element to form the third input terminal, wherein the quantity and direction of current flowing from the second terminal to the third terminal are varied on the basis of the level of the voltage applied to the first terminal; and first and second load impedances connected between the second terminals of the first and second amplification elements and a voltage source, respectively.

In accordance with another aspect of the present invention, there is provided a mixer circuit including: an amplification unit having an input terminal and an output terminal, the amplification unit amplifying a signal applied to the input terminal to output it to the output terminal; and a mixing unit having first, second and third input terminals, and first and second output terminals, the third input terminal being connected to the output terminal of the amplification unit, the mixing unit mixing signals respectively applied to the first and second input terminals with a signal supplied to the third input terminal, to respectively output the mixed signals to the first and second output terminals, wherein the amplification unit includes an amplification element having a first terminal that forms the input terminal, a second terminal that forms the output terminal and a third terminal, the quantity and direction of current flowing from the second terminal to the third terminal being varied on the basis of the level of a voltage applied to the first terminal; a degeneration impedance connected between the third terminal of the amplification element and a second voltage source; and a capacitor connected between the first and second terminals of the amplification unit.

In the mixer circuit in accordance with another aspect of the present invention, the mixing unit includes a first amplification element having a first terminal that forms the first input terminal, a second terminal that forms the first output terminal and a third terminal, wherein the quantity and direction of current flowing from the second terminal to the third terminal are varied on the basis of the level of a voltage applied to the first terminal; a second amplification element having a first terminal that forms the second input terminal, a second terminal that forms the second output terminal, and a third terminal connected to the third terminal of the first amplification element to form the third input terminal, wherein the quantity and direction of current flowing from the second terminal to the third terminal are varied on the basis of the level of the voltage applied to the first terminal; and first and second load impedances connected between the second terminals of the first and second amplification elements and a voltage source, respectively.

In the mixer circuit in accordance with another aspect of the present invention, the mixing unit further includes capacitors each of which is connected between the first and second terminals of each of the first and second amplification elements.

In accordance with another aspect of the present invention, there is also provide a mixer circuit including: an amplification unit having an input terminal and an output terminal, the amplification unit amplifying a signal applied to the input terminal to output it to the output terminal; and a mixing unit having first, second and third input terminals, first and second output terminals, the third input terminal being connected to the output terminal of the amplification unit, the mixing unit mixing signals respectively applied to the first and second input terminals with a signal supplied to the third input terminal, to respectively output the mixed signals to the first and second output terminals, wherein the mixing unit includes a first amplification element having a first terminal that forms the first input terminal, a second terminal that forms the first output terminal and a third terminal, the quantity and direction of current flowing from the second terminal to the third terminal being varied on the basis of the level of a voltage applied to the first terminal; a second amplification element having a first terminal that forms the second input terminal, a second terminal that forms the second output terminal, and a third terminal connected to the third terminal of the first amplification element to form the third input terminal, the quantity and direction of current flowing from the second terminal to the third terminal being varied on the basis of the level of the voltage applied to the first terminal; first and second capacitors, the first capacitor being connected between the first and second terminals of the first amplification element, the second capacitor being connected between the first and second terminals of the second amplification element; and first and second load impedances connected between the second terminals of the first and second amplification elements and a voltage source, respectively.

It is to be understood that both the foregoing general description and the following detailed description of the present invention are exemplary and explanatory and are intended to provide further explanation of the invention as claimed.

BRIEF DESCRIPTION OF THE DRAWINGS

The above and other objects, features and advantages of the present invention will be apparent from the following detailed description of the preferred embodiments of the invention in conjunction with the accompanying drawings, in which.

DETAILED DESCRIPTION OF THE INVENTION

Reference will now be made in detail to the preferred embodiments of the present invention, examples of which are illustrated in the accompanying drawings.

A mixer circuit according to the present invention uses a bipolar junction transistor amplifier device that includes a base, a collector and an emitter. The bipolar function transistor has a characteristic that the quantity and direction of current flowing from the collector to the emitter or flowing from the emitter to the collector are determined according to the level and polarity of a voltage applied to the base. This amplifier device includes a bipolar junction transistor (BJT), a junction field effect transistor (JFET), a metal-oxide-semiconductor field effect transistor (MOSFET) and a metal-semiconductor field effect transistor (MESFET).

Most amplifier devices utilize two complementary elements, that is, a first complementary element such as an NPN transistor and a second complementary element such as a PNP transistor. Each of the first and second complementary elements has a characteristic that the quantity of direction of current flowing from the collector to the emitter or from emitter to the collector are decided according to the level and polarity of a voltage applied to the base.

Among the above-described amplifier devices, the bipolar junction transistor frequently used in RF circuits is adopted for the mixer circuit of the present invention. However, it is apparent to those skilled in the art that the spirit of the present invention can be applied to not only the bipolar junction transistor but also all devices that operate complimentarily. Therefore, while the bipolar junction transistor is adopted in the specification, the scope and spirit of the present invention are not limited to the bipolar junction transistor. Furthermore, although NPN transistors are explained in the following description, the present invention can be also applied to PNP transistors.

Figure 1:
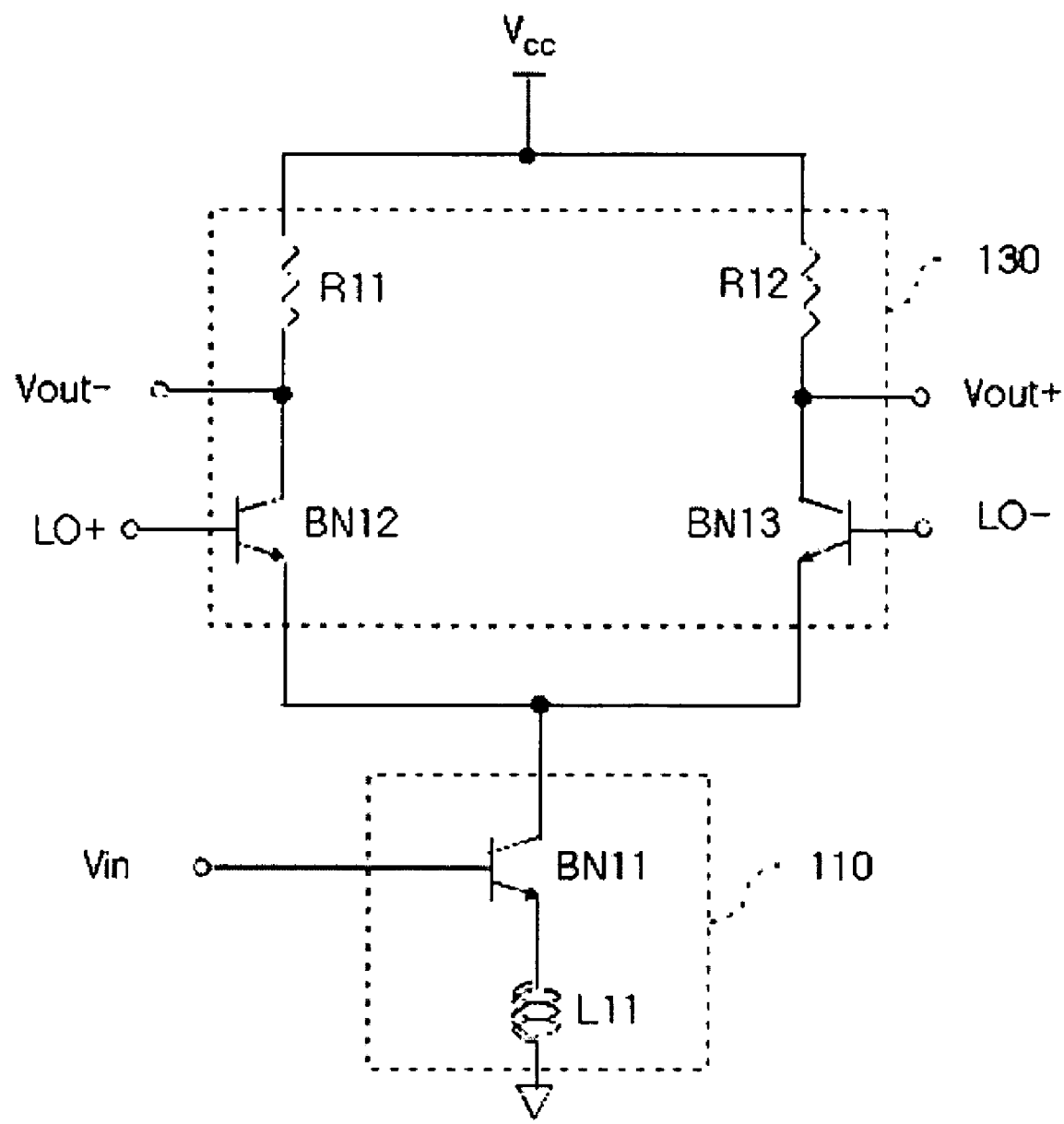
FIG. 1 is a circuit diagram of a conventional Gilbert cell mixer circuit.
Figure 2:
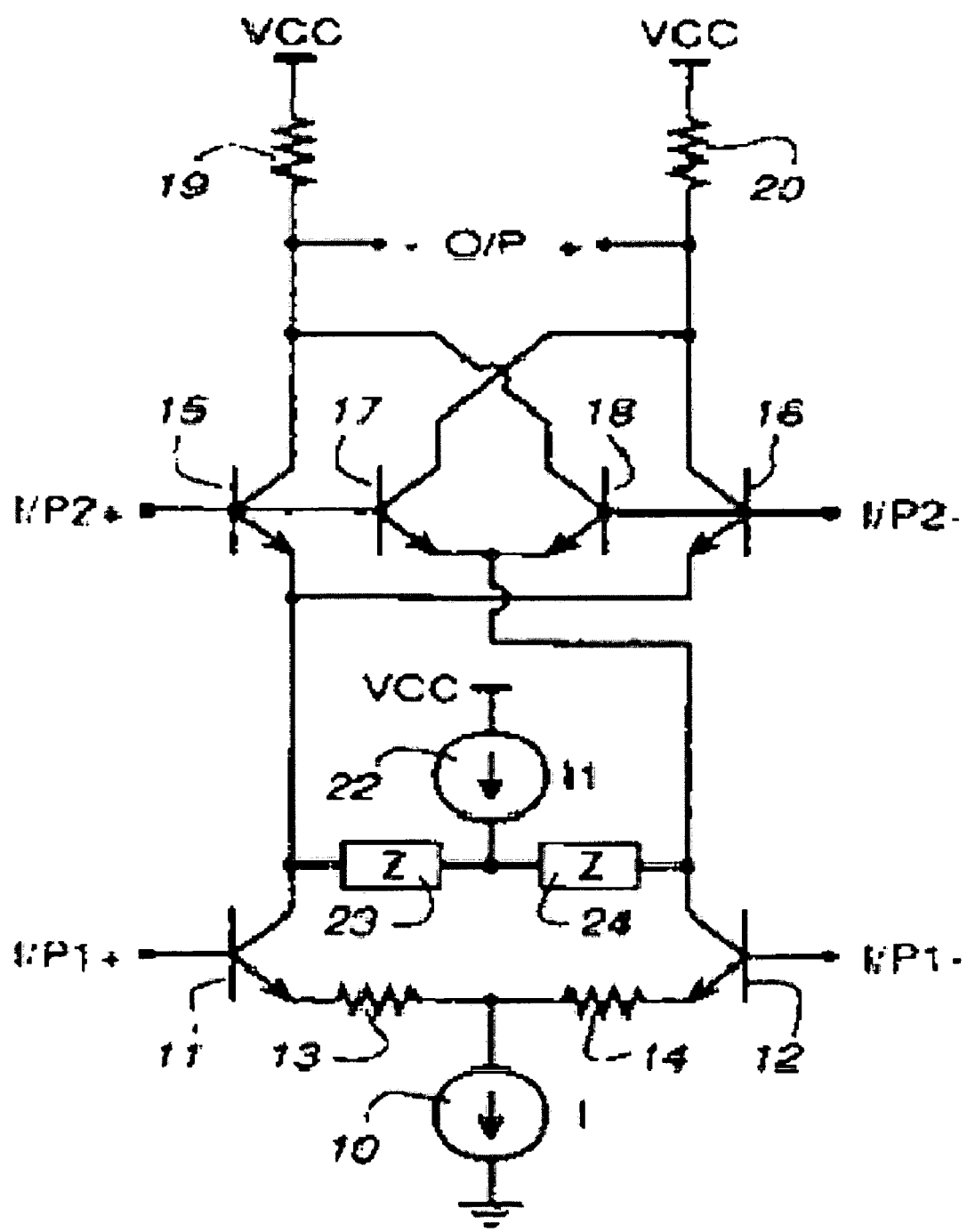
FIG. 2 is a circuit diagram of a conventional mixer circuit.
Figure 3:
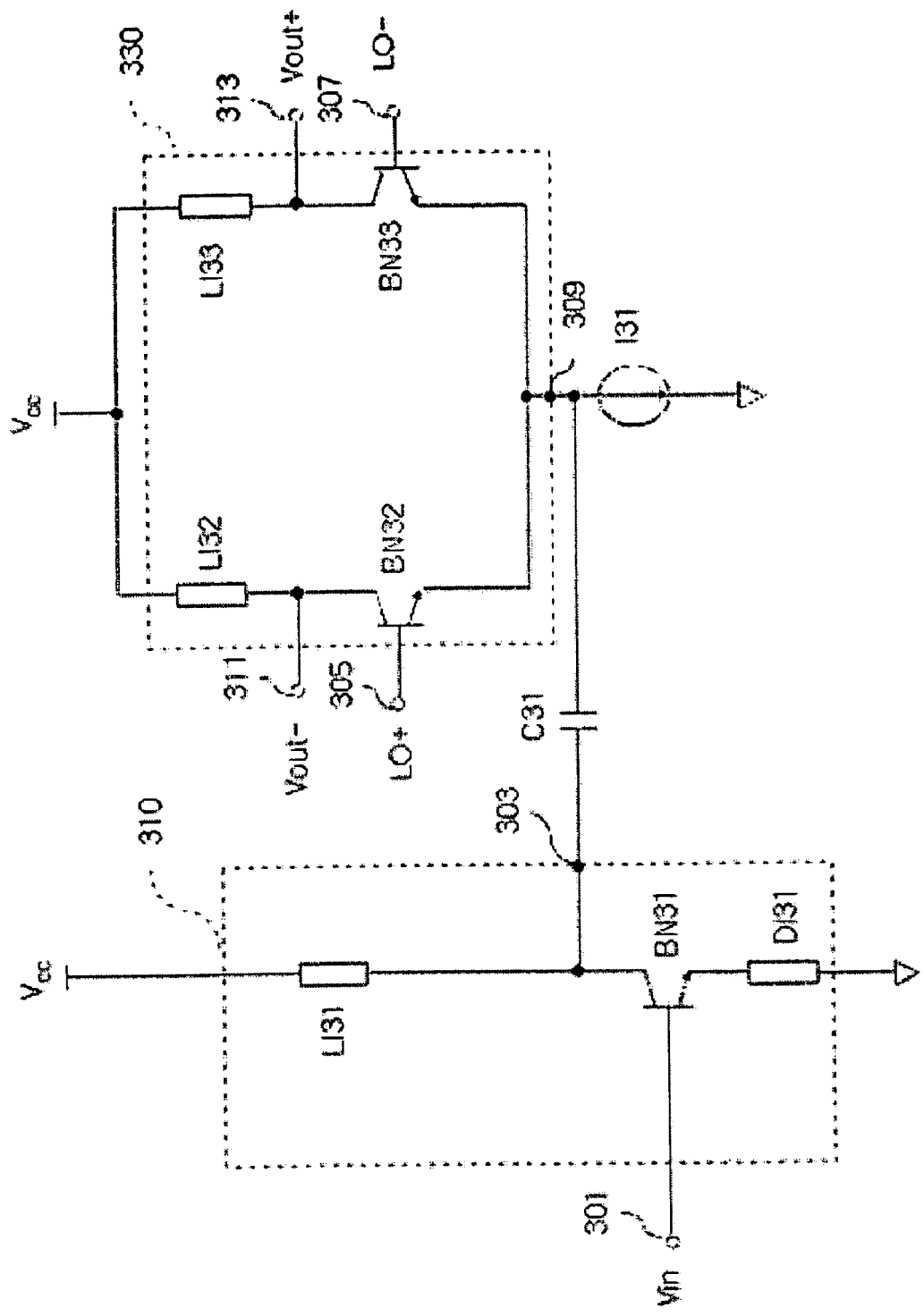
FIG. 3 is a circuit diagram of a mixer circuit according to an embodiment of the present invention.

FIG. 3 is a circuit diagram of the mixer circuit according to an embodiment of the present invention. Referring to FIG. 3, the mixer circuit includes an amplification unit 310, a mixing unit 330, a first capacitor C31, and a first current source I31. The amplification unit 310 has an input terminal 301 and an output terminal 303 and amplifies a signal Vin applied to the input terminal 301. The mixing unit 330 has first, second and third input terminals 305, 307 and 309, and first and second output terminals 311 and 313. The mixing unit 330 mixes local oscillation signals LO+ and LO− respectively applied to the first and second input terminals 305 and 307 with a signal supplied to the third input terminal 309 to output the mixed signals to the first and second output terminals 311 and 313.

Specifically, the amplification unit 310 includes a first NPN transistor BN31, a degeneration impedance DI31 and a first load impedance LI31 and has an emitter common structure. That is, the base of the first NPN transistor BN31 forms the input terminal 301, its collector is connected to one end of the first load impedance LI31 to form the output terminal 303, and its emitter is coupled to one end of the degeneration impedance DI31. The other end of the first load impedance LI31 is connected to Vcc and the other end of the degeneration impedance DI31 is grounded.

In the mixer circuit according to an embodiment of the present invention, a second capacitor (not shown) can be provided between the base and collector of the first NPN transistor BN31. In this case, the second capacitor removes the influence of parasitic capacitance existing between the base and collector of the first NPN transistor BN31 so as to improve linearity of the mixer circuit.

The mixing unit 330 includes second and third NPN transistors BN32 and BN33, and second and third load impedances LI32 and LI33, and has a base common structure. That is, the bases of the second and third transistors BN32 and BN33 respectively form the first and second input terminals 305 and 307, and their collectors are connected to one end of the second load impedances LI32 and one end of the third load impedance LI33 to form the first and second output terminals 311 and 313, respectively. In addition, the emitters of the second and third transistors BN32 and BN33 are connected to each other to form the third input terminal 309 of the mixing unit 330. The other ends of the second and third load impedances LI32 and LI33 are connected to Vcc.

The first capacitor C31 is connected between the output terminal 303 of the amplification unit 310 and the third input terminal 309 of the mixing unit 330. The first current source I31 is coupled to the third input terminal 309 of the mixing unit 330.

The operation of the mixer circuit according to an embodiment of the present invention will be described hereinafter.

The amplification unit 310 amplifies a signal applied to the input terminal 301 and outputs the amplified signal. Specifically, the first NPN transistor BN31 varies current flowing from the collector to the emitter on the basis of the level of voltage applied to the input terminal 301, to amplify the signal Vin supplied to the input terminal 301.

The mixing unit 330 mixes the local oscillation signals LO+ and LO−, respectively applied to the first and second input terminals 305 and 307, with the output signal supplied to the third input terminal 309, to output signals having a frequency corresponding to the difference between the frequencies of the two mixed signals or the sum of them to the first and second output terminals 311 and 313.

The first capacitor C31 blocks a DC component generated between the amplification unit 310 and the mixing unit 330 so as to separate the amplification unit 310 and the mixing unit 330 from each other.

The first current source I31 provides a specific quantity of current to the third input terminal 309 of the mixing unit 330 to allow the mixer circuit to operate in optimum state. In this case, the quantity of current provided by the first current source I31 and amplification unit 310 is identical to the sum of currents Ic passed by the collectors of the second and third NPN transistors BN32 and BN33 of the mixing unit 330 and larger than the quantity of current passed by the first NPN transistor BN31 of the amplification unit 310.

That is, the amplification unit 310 is separated from the mixing unit 330 and the first current source I31 is connected to the third input terminal 309 of the mixing unit 330 such that the quantity of current passed through the mixing unit 330 is larger than the quantity of current flowing through the amplification unit 310. This can improve linearity and noise figure of the mixer circuit.

The operation of the mixer circuit according to an embodiment of the present invention will be described in more detail hereinafter.

In the mixer circuit for mixing at least two signals with each other, linearity and noise figure are very important factors for deciding the performance of the mixer.

In terms of linearity of the mixer, in the case where more than two circuits are cascade-connected, as the mixer circuit shown in FIG. 3, the entire linearity depends on the gain and linearity of the first stage and the gain and linearity of the second stage. That is, the smaller the gain of the first stage becomes, the higher the entire linearity becomes. The optimal entire linearity can be obtained only when the linearity of the second stage is as high as the gain of the first stage. In the case where the gain of the first stage is high, a high-level signal is applied to the second stage. This requires the mixer circuit to operate more linearly. Accordingly, it is preferable that the gain of the first stage is reduced and the gain of the second stage is increased to maintain a desired total gain and the linearity of the second stage is as high as the gain of the first stage in order to improve the entire linearity of the mixer. In case of the mixer, its entire linearity can be optimized only when the gain of the amplification unit 310 is appropriately controlled and linearity of the mixing unit 330 is increased as high as the gain of the amplification unit 310.

In a non-linear device such as a bipolar junction transistor, its linearity is in proportion to collector current Ic of the transistor and voltage Vce between its collector and emitter. Accordingly, the linearity of the mixer circuit can be optimized by setting bias voltage and load impedance to predetermined appropriate values.

In the conventional mixer circuit, however, the amplification unit and the mixing unit are directly connected to each other so that current passed through the mixing unit is restricted by current flowing through the amplification unit. In case of the mixer circuit of the present invention, the amplification unit 310 and the mixing unit 330 are separately and independently controlled so that the linearity of the mixer circuit can be improved.

In terms of noise figure of the mixer, in the case where more than two circuits are cascade-connected as the mixer circuit shown in FIG. 3, noise figure is improved as the gain of the first stage is increased. The gain of the amplification unit 310 is proportional to transconductance gm of the first NPN transistor BN31 and the impedance value of the first load impedance LI31.

While the amplification unit 310 and the mixing unit 330 are directly connected to each other so that there is a limitation in independently controlling gains of the amplification unit and the mixing unit in the conventional mixer circuit, noise figure can be improved by increasing the gain of the amplification unit 310 in case of the mixer circuit of the present invention.

In the mixer circuit according to an embodiment of the present invention, collector current Ic of the first NPN transistor BN31 is determined by bias voltage applied to the base of the first NPN transistor BN31, and voltage Vce between the collector and emitter of the first NPN transistor BN31 is decided by the collector current Ic and the first load impedance LI31. Accordingly, linearity and noise figure of the amplification unit 310 can be optimized by setting the bias voltage applied to the first NPN transistor BN31 and the first load impedance LI31 to appropriate values.

In the mixer circuit according to an embodiment of the present invention, the sum of currents passed by the collectors of the second and third NPN transistors BN32 and BN33 is identical to the quantity of current passed by the first current source I31. Voltages between the collectors and emitters of the second and third NPN transistors BN32 and BN33 are decided by the currents passed by the collectors of the second and third NPN transistors BN32 and BN33, the second and third load impedances LI32 and LI33. Accordingly, linearity and noise figure of the mixing unit 330 can be controlled independently of the amplification unit 310 by setting the currents passed by the collectors of the second and third NPN transistors BN32 and BN33, the second and third load impedances LI32 and LI33 to appropriate values.

Consequently, the amplification unit 310 and the mixing unit 330 of the mixer circuit are separated from each other and the gain and linearity of the amplification unit 310 is controlled independently of those of the mixing unit 320 so as to obtain optimal linearity and noise figure of the mixer circuit.

Figure 4:
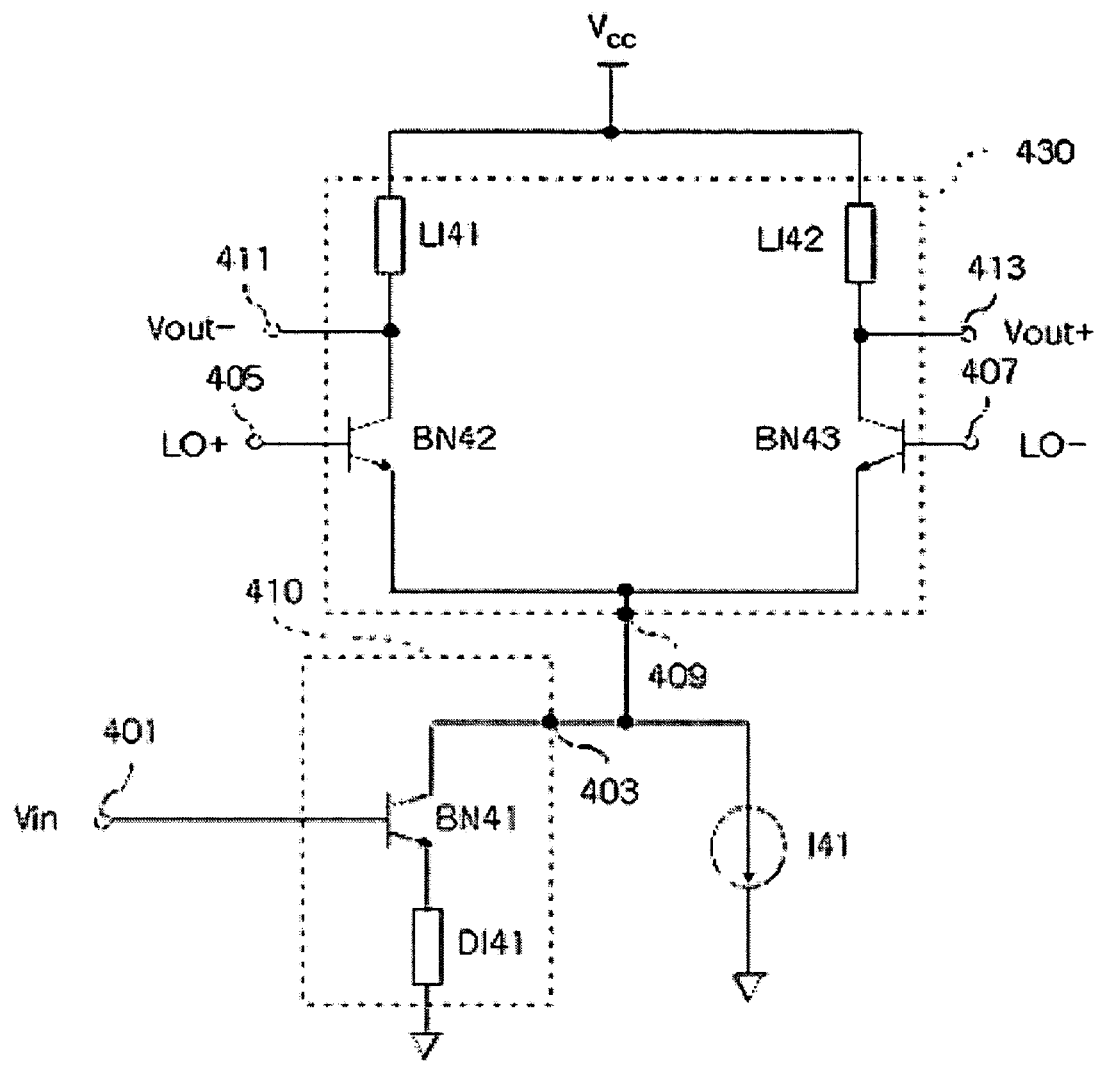
FIG. 4 is a circuit diagram of a mixer circuit according to another embodiment of the present invention.

FIG. 4 is a circuit diagram of a mixer circuit according to another embodiment of the present invention. Referring to FIG. 4, the mixer circuit is distinguished from the mixer circuit shown in FIG. 3 in that an amplification unit 410 and a mixing unit 430 that are independently optimized are directly connected to each other.

The composition and operation of the mixer circuit shown in FIG. 4 will be described hereinafter.

The amplification unit 410 of the mixer circuit according to another embodiment of the present invention includes a first NPN transistor BN41 and a degeneration impedance DI41. The base of the first NPN transistor BN41 forms an input terminal 401 of the amplification unit 410, and its collector forms an output terminal 403 of the amplification unit 410. The emitter of the first NPN transistor BN41 is connected to one end of the degeneration impedance DI41. The other end of the degeneration impedance DI41 is grounded.

Even in the mixer circuit according to another embodiment of the present invention, a capacitor can be provided between the collector and base of the first NPN transistor BN41. In this case, the capacitor removes the influence of parasitic capacitance existing between the collector and base of the first NPN transistor BN41.

The mixing unit 430 includes second and third NPN transistors BN42 and BN43, and first and second load impedances LI41 and LI42. The composition of the mixing unit 430 is identical to that of the mixer circuit shown in FIG. 3 so that explanation therefor is omitted.

The operation of the mixer circuit according to another embodiment of the present invention will be described hereinafter.

Bias voltage (not shown) supplied to the bases of the second and third NPN transistors BN42 and BN43 is controlled while a first current source I41 is not being connected to the mixer circuit, to apply a predetermined voltage between the collector and emitter of the first NPN transistor BN41. As described above, voltage Vce applied between the emitter and collector of the first NPN transistor BN41 should be increased in proportion to current passed through the collector of the first NPN transistor BN41 in order to improve linearity of the mixer circuit.

Accordingly, the bias voltage of the second and third NPN transistors BN42 and BN43 of the mixing unit 430 is controlled so as to apply optimal voltage between the collector and emitter of the first NPN transistor BN41. In this case, while the optimal voltage and current are applied between the collector and emitter of the first NPN transistor BN41, the currents passed by the collectors of the second and third NPN transistors BN42 and BN43 may not satisfy linearity of the mixing unit 430, that is, linearity that should be as high as the gain of the amplifier 410.

Here, the first current source I41 can be provided between the collector of the first NPN transistor BN41 (that is, the output terminal 403 of the amplification unit 410) and the third input terminal 409 of the mixing unit 430 to allow optimal current to flow through the collectors of the second and third NPN transistors BN42 and BN43 in terms of linearity. As seen in FIG. 4, the amplification unit 410 and the mixing unit 430 are connected solely by the output terminal 403 and the third input terminal 409.

Consequently, the present invention controls the collector current Ic of the first NPN transistor BN41, the collector-emitter voltage Vce of the first NPN transistor BN41, and the currents passed through the collectors of the second and third NPN transistors. By doing so, optimal current and voltage for linearity can be applied to the mixer circuit to improve the linearity of the mixer circuit.

Figure 5:
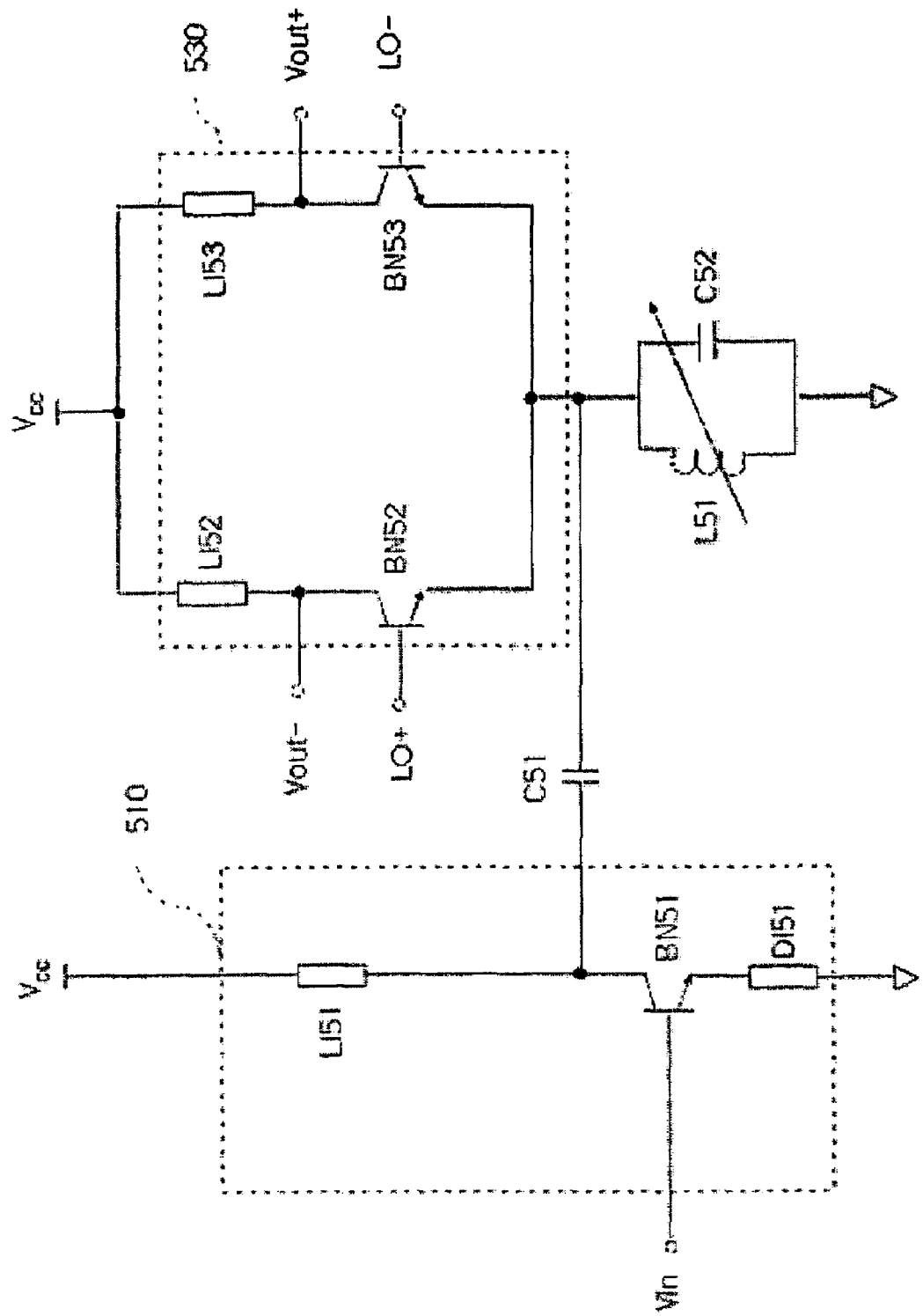
FIG. 5 is a circuit diagram of a mixer circuit according to another embodiment of the present invention.

FIG. 5 is a circuit diagram of a mixer circuit according to another embodiment of the present invention. The mixer circuit shown in FIG. 5 is distinguished from the mixer circuit shown in FIG. 3 in that the first current source I31 is composed of an inductor L51 and a capacitor C52 connected in parallel with each other. That is, an LC resonance circuit instead of the first current source I31 is used to eliminate harmonic components including the second harmonic of an input radio frequency signal Vin and the second harmonic of the local oscillation signals LO+ and LO−. This can prevent degeneration of linearity due to the harmonic components.

While the LC resonance circuit capable of removing harmonic components of an input signal is composed of the inductor L51 and the capacitor C51 connected in parallel with each other in FIG. 5, the inductor and the capacitor can be serially connected to each other. In addition, the mixer circuit shown in FIG. 5 can employ the first current source I31 of the mixer circuit shown in FIG. 3.

Figure 6:
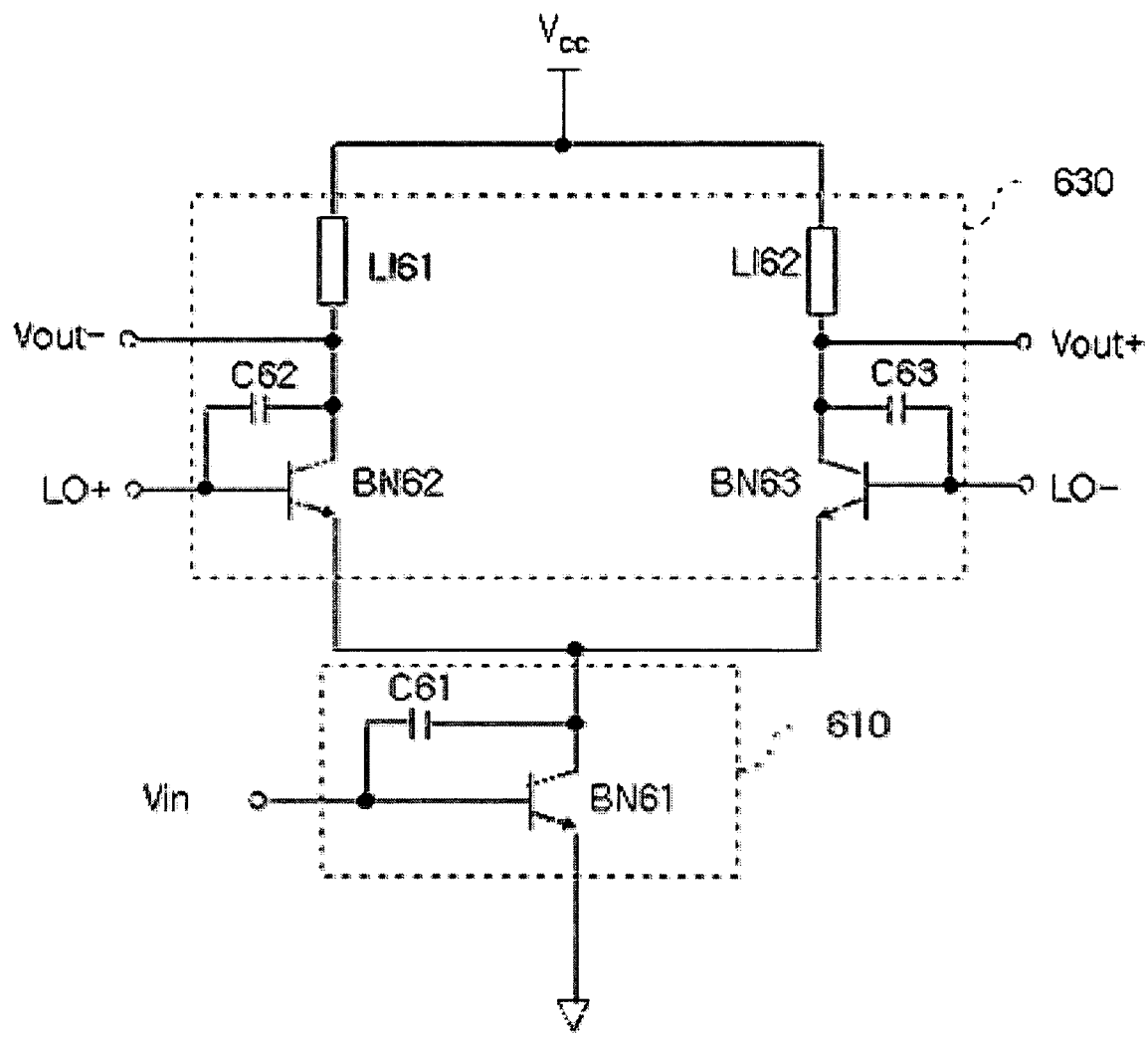
FIG. 6 is a circuit diagram of a mixer circuit according to another embodiment of the present invention.

FIG. 6 is a circuit diagram of a mixer circuit according to another embodiment of the present invention. Referring to FIG. 6, the mixer circuit according to another embodiment of the present invention includes an amplification unit 610 and a mixing unit 630. A capacitor C41 is connected between the collector and base of a first NPN transistor BN61 included in the amplification unit 610 to remove non-linearity due to parasitic capacitance existing at the input terminal of the mixer circuit.

Specifically, parasitic capacitance existing between the collector and base of the first NPN transistor BN61 is varied with a voltage applied to the input terminal, to deteriorate linearity of the mixer circuit. Accordingly, the capacitor C41 is connected between the collector and base of the first NPN transistor BN61, as shown in FIG. 6, such that the parasitic capacitance and the capacitor C41 are connected in parallel between the collector and base of the first NPN transistors BN61. Thus, the influence of the parasitic capacitance can be removed by appropriately controlling the capacitance of the capacitor C41.

Furthermore, second and third capacitors C62 and C63 are connected between the collectors and bases of second and third NPN transistors BN62 and BN63, respectively, as shown in FIG. 6. This can eliminate parasitic capacitance existing between the collector and base of each of the second and third NPN transistors BN62 and BN63.

While a single-ended type mixer circuit has been described in the aforementioned four embodiments, it will be apparent to those skilled in the art that the present invention can be applied to a mixer circuit composed of a differential pair.

INDUSTRIAL APPLICABILITY

According to the present invention, linearity and noise figure of the mixer circuit can be improved. Furthermore, the amplification unit and the mixing unit of the mixer circuit are separately controlled so that they can be optimized independently. Moreover, the present invention can eliminate the influence of parasitic capacitance generated at the input terminals of the amplification unit and the mixing unit of the mixer circuit to improve linearity of the mixer circuit.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

What is claimed is:

1. A mixer circuit comprising:
   an amplification unit having an input terminal and an output terminal, and amplifying a radio frequency signal applied to the input terminal to output the signal to the output terminal;
   a mixing unit having first, second, and third input terminals, first and second output terminals, the third input terminal being connected to the output terminal of the amplification unit, the mixing unit mixing local oscillation signals respectively applied to the first and second input terminals with the radio frequency signal supplied to the third input terminal, to output respectively the mixed signals to the first and second output terminals, the mixing unit being arranged between a supply voltage and the amplification unit; and
   a current source being configured to provide a bias current to the amplification unit and the mixing unit, and being connected to the output terminal of the amplification unit and the third input terminal of the mixing unit,
   the current source and the third input being directly connected.

2. The mixer circuit according to claim 1, wherein the amplification unit includes,
   an amplification element having a first terminal that forms the input terminal, a second terminal that forms the output terminal and a third terminal, wherein the quantity and direction of current flowing from the second terminal to the third terminal are varied on the basis of the level of a voltage applied to the first terminal; and
   a degeneration impedance connected between the third terminal of the amplification element and a voltage source.

3. The mixer circuit according to claim 2, wherein the amplification unit further includes a capacitor connected between the first and second terminals of the amplification element.

4. The mixer circuit according to claim 1, wherein the mixing unit includes,
   a first amplification element having a first terminal that forms the first input terminal, a second terminal that forms the first output terminal and a third terminal, wherein the quantity and direction of current flowing from the second terminal to the third terminal are varied on the basis of the level of a voltage applied to the first terminal;
   a second amplification element having a first terminal that forms the second input terminal, a second terminal that forms the second output terminal, and a third terminal connected to the third terminal of the first amplification element to form the third input terminal, wherein the quantity and direction of current flowing from the second terminal to the third terminal are varied on the basis of the level of the voltage applied to the first terminal; and
   first and second load impedances respectively connected between the second terminals of the first and second amplification elements and a voltage source.

5. The mixer circuit according to claim 1, wherein the quantity of current being provided to the third input terminal of the mixing unit being equal to the specific quantity of current provided by the current source and a quantity of current provided by the amplification unit.

6. The mixer circuit according to claim 1, wherein the mixing unit being connected to the amplification unit solely by the third input terminal being connected to the output terminal of the amplification unit.

7. The mixer circuit according to claim 1, wherein the mixing circuit is configured to mix at least two input signals to output a signal having a frequency corresponding to the difference between the mixed at least two signals or the sum of the at least two signals.

8. The mixer circuit according to claim 1, wherein the input signal applied to the input terminal of the amplification unit is mixed with a differential signal applied to the first and second input terminals of the mixing unit.

9. The mixer circuit according to claim 1, wherein the current source is a LC resonance circuit.

* * * * *